(12) United States Patent
Zhou et al.

(10) Patent No.: US 8,836,061 B2
(45) Date of Patent: Sep. 16, 2014

(54) MAGNETIC TUNNEL JUNCTION WITH NON-METALLIC LAYER ADJACENT TO FREE LAYER

(71) Applicant: Avalanche Technology, Inc., San Jose, CA (US)

(72) Inventors: Yuchen Zhou, San Jose, CA (US); Yiming Huai, Pleasanton, CA (US); Zihui Wang, Milpitas, CA (US); Dong Ha Jung, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/912,107

(22) Filed: Jun. 6, 2013

(65) Prior Publication Data

US 2013/0334633 A1 Dec. 19, 2013

Related U.S. Application Data

(60) Provisional application No. 61/656,505, filed on Jun. 6, 2012, provisional application No. 61/757,021, filed on Jan. 25, 2013, provisional application No. 61/761,678, filed on Feb. 6, 2013.

(51) Int. Cl.
*H01L 29/82* (2006.01)
*H01L 43/00* (2006.01)
*H01L 43/10* (2006.01)
*H01L 43/08* (2006.01)

(52) U.S. Cl.
CPC .................... *H01L 43/10* (2013.01); *H01L 43/08* (2013.01)
USPC ............. 257/421; 257/E21.002; 257/E43.006

(58) Field of Classification Search
CPC ........................................................ H01L 43/10
USPC ............ 257/421, E21.002, E43.006; 369/126
See application file for complete search history.

(56) References Cited

U.S. PATENT DOCUMENTS

| | | | |
|---|---|---|---|
| 2010/0074092 A1 | 3/2010 | Zhu et al. | |
| 2013/0215672 A1* | 8/2013 | Zhou et al. | 365/158 |
| 2014/0038314 A1* | 2/2014 | Zhou | 438/3 |
| 2014/0103472 A1* | 4/2014 | Kent et al. | 257/421 |
| 2014/0169083 A1* | 6/2014 | Wang et al. | 365/158 |

OTHER PUBLICATIONS

"Spin pumping in Co56Fe24B20 multilayer systems", H. Lee, et.al., J. Phys. D: Appl. Phys. 41, 215001, (2008).

(Continued)

*Primary Examiner* — David S Blum
(74) *Attorney, Agent, or Firm* — Maryam Imam; Bing K Yen (57) ABSTRACT

A spin transfer torque magnetic random access memory (STTMRAM) magnetic tunnel junction (MTJ) stack includes layers to which when electric current is applied cause switching of the direction of magnetization of at least one of the layer. The STTMRAM MTJ stack includes a reference layer (RL) with a direction of magnetization that is fixed upon manufacturing of the STTMRAM MTJ stack, a junction layer (JL) formed on top of the RL, a free layer (FL) formed on top of the JL. The FL has a direction of magnetization that is switchable relative to that of the RL upon the flow of electric current through the spin transfer torque magnetic random access memory (STTMRAM) magnetic tunnel junction (MTJ) stack. The STTMRAM MTJ stack further includes a spin confinement layer (SCL) formed on top of the FL, the SCL made of ruthenium.

30 Claims, 5 Drawing Sheets

(56) References Cited

OTHER PUBLICATIONS

"Enhanced Gilbert Damping in Thin Ferromagnetic Films", Y. Tserkovnyak, et.al. ,Phys. Rev. Lett. 88, 117601-1, (2002).

"Spin battery operated by ferromagnetic resonance", A. Brataas, Y. Tserkovnyak, G. E. W. Bauer, and B. I.Halperin, Phys. Rev. B 66, 060404 (2002).

* cited by examiner

MAGNETIC TUNNEL JUNCTION WITH NON-METALLIC LAYER ADJACENT TO FREE LAYER

CROSS REFERENCE TO RELATED APPLICATIONS

This application claims priority to U.S. Provisional Patent Application No. 61/656,505, filed on Jun. 6, 2012, by Yuchen Zhou, et al., and entitled "Magnetic Tunnel Junction with Non-Metallic Layer Adjacent to Free Layer" and claims priority to U.S. Provisional Patent Application No. 61/757,021, filed on Jan. 25, 2013, by Zihui Wang, et al., and entitled "Magnetic tunnel junction with doped oxide layer adjacent to free layer", and claims priority to U.S. Provisional Patent Application No. 61/761,678, filed on Feb. 6, 2013, by Zihui Wang, et al., and entitled "Magnetic tunnel junction with doped oxide layer adjacent to free layer (CIP)", the disclosures of which are incorporated by reference herein as though set forth in full.

BACKGROUND OF THE INVENTION

1. Field of the Invention

The invention relates generally to magnetic tunnel junction (MTJ) and particularly to spin transfer torque magnetic random access memory (STTMRAM) employing MTJ.

2. Description of the Prior Art

A typical spin transfer torque magnetic random access memory (STTMRAM) magnetic tunnel junction (MTJ) stack has a pinned reference layer whose magnetization is fixed in a certain direction by either intrinsic anisotropy field or through an exchange coupling field from an adjacent magnetic layer. The MTJ of the STTMRAM also has a switchable free layer, whose magnetization direction can be switched relative to that of the pinned reference layer when electric current flows between the pinned reference layer and the switchable free layer through a junction layer, which is typically made of an oxide of magnesium (Mg), aluminum (Al) and titanium (Ti), or a metallic layer of copper (Cu), silver (Au), or gold (Ag), where the different relative angles of the magnetization directions between the free layer and reference layer cause different resistance levels across the MTJ stack. Thus, by switching the free layer magnetization directions with the electric current, an STTMRAM can be switched into high and low resistance states.

Figure 1:
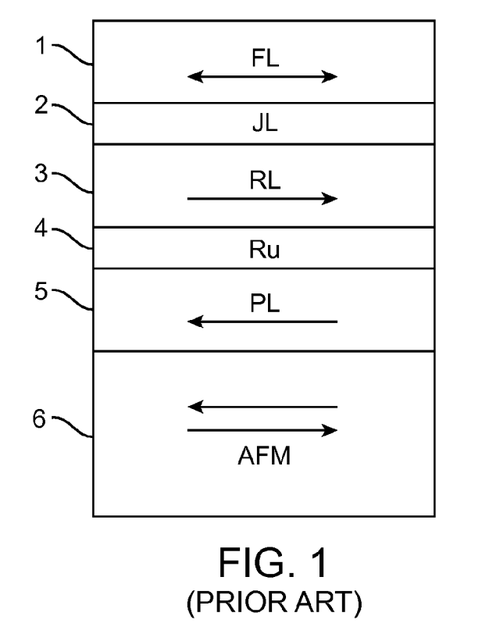
FIG. 1 shows a typical prior art STTMRAM stack structure with in-plane magnetization in the magnetic layers.

FIG. 1 shows a typical prior art STTMRAM stack structure with in-plane magnetization in the magnetic layers. Layer 1 is a free layer whose magnetization can be switched in-plane by applying an electric current through the stack. Layer 2 is the MTJ junction layer. Layer 3 is the reference layer. Layer 4 is typically a ruthenium layer. Layer 5 is the pinned reference layer. Layer 6 is an antiferromagnetic (AFM) layer. Layer 3 and layer 5 are exchange coupled through layer 4 with anti-ferromagnetic orientation. The tri-layer structure made of the layers 3, 4 and 5 is generally referred to as a synthetic-anti-ferromagnetic (SAF) structure, which shows effective magnetic moment to be about 0 due to strong antiferromagnetic coupling between the layer 3 and the layer 5. Layer 6 then exchange couples to layer 5, and the SAF, and pins the SAF magnetizations in-plane.

In a well-known physics phenomenon, called "spin-pumping", the dynamic magnetization resonance and oscillation during the switching process of a magnetic layer may create a spin current in the non-magnetic metal layer that is in direct contact with the magnetic layer. Such spin current is undesirable in the STTMRAM as it increases the effective damping of the magnetic layer, especially in the free layer of the STTMRAM, and makes switching of the magnetization by electric current more difficult.

In prior art using an oxide layer in between the magnetic free layer and the metal contact layer that leads electric current into the MTJ, the effect of spin pumping may be reduced. Such reduction is caused by the spin scattering through a non-conductive magnesium oxide (MgO) layer that quenches or dissipates the uniform spin current from the spin-pumping effect. Thus, effective damping is reduced and switching of the free layer is easier by electric current. However, the practical application of the STTMRAM MTJ stack is quite restrictive and prevents wide use of these devices for at least the following reasons.

Typical oxide material, for example magnesium oxide (MgO), is usually non-conductive therefore producing a large resistance if used with a thickness larger than 1 nano meter (nm). For spin-pumping quenching purpose, a thicker oxide layer, or more properly referred to as a spin confinement layer (SCL), which confines spin only to the magnetic layers, is generally preferred. Such preference however, presents a dilemma in using normal insulator-like oxide material because generally a thicker layer is preferred for quenching spin current but it undesirably produces too high of a resistance and low tunnel magnetoresistance (TMR) in patterned MTJs, employed in STTMRAM devices.

What is needed is a STTMRAM MTJ stack having a spin-pumping suppression layer with low resistance and suitable for practical applications.

SUMMARY OF THE INVENTION

To overcome the limitations in the prior art described above, and to overcome other limitations that will become apparent upon reading and understanding the present specification, this invention discloses a method and a corresponding structure for a magnetic memory with a spin confinement layer (SCL), adjacent to the free layer, that is non-metallic and conductive for suppressing spin-pumping to reduce the resistance of the magnetic memory.

Briefly, an embodiment of the invention includes a spin transfer torque magnetic random access memory (STTMRAM) magnetic tunnel junction (MTJ) stack made of layers to which when electric current is applied cause switching of the direction of magnetization of at least one of the magnetic layer. The STTMRAM MTJ stack includes a reference layer (RL) with a direction of magnetization that is fixed upon manufacturing of the STTMRAM MTJ stack, a junction layer (JL) formed on top of the RL, a free layer (FL) formed on top of the JL. The FL has a direction of magnetization that is switchable relative to that of the RL upon the flow of electric current through the spin transfer torque magnetic random access memory (STTMRAM) magnetic tunnel junction (MTJ) stack. The STTMRAM MTJ stack further includes a spin confinement layer (SCL) formed on top of the FL, the SCL made of materials that will help reduce the spin pumping effect.

These and other objects and advantages of the present invention will no doubt become apparent to those skilled in the art after having read the following detailed description of the preferred embodiments illustrated in the several figures of the drawing.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention.

Figure 2:
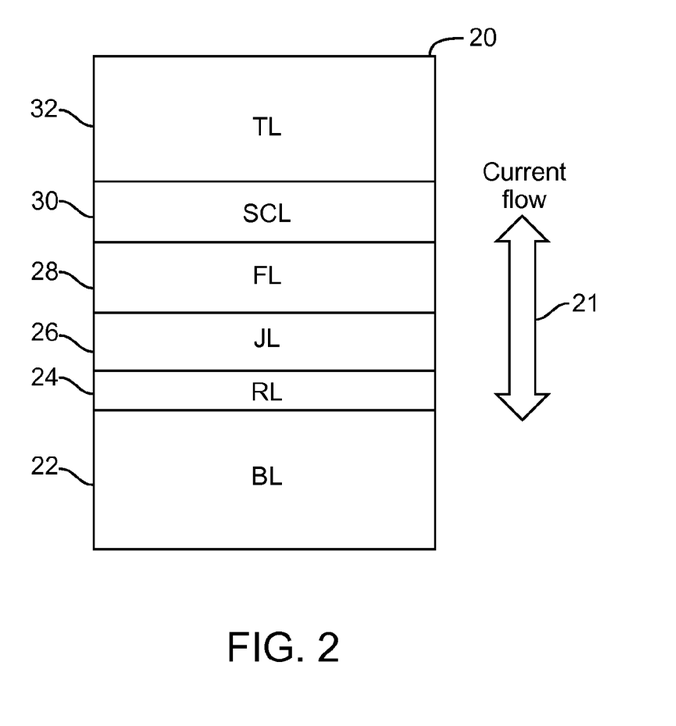
FIG. 2 shows a spin transfer torque magnetic random access memory (STTMRAM) magnetic tunnel junction (MTJ) stack 20, in accordance with an embodiment of the invention.

Referring now to FIG. 2, a spin transfer torque magnetic random access memory (STTMRAM) magnetic tunnel junction (MTJ) stack 20 is shown, in accordance with an embodiment of the invention. The stack 20 is shown to include the following layers: a bottom layer (BL) 22, a reference layer (RL) 24, a junction layer (JL) 26, a free layer (FL) 28, a spin confinement layer (SCL) 30, and at a top layer (TL) 32. The RL 24 is shown formed on top of the BL 22, the JL 26 is shown formed on top of the RL 24, the FL 28 is shown formed on top of the JL 26, the SCL 30 is shown formed on top of the FL 28, and the TL 32 is shown formed on top of the SCL 30. It is understood that even though this is not shown, intermediate layers may be formed between the foregoing layers, as one of ordinary skill in the art might do.

In FIG. 2, electric current whose direction is shown by the arrow 21, flows through the stack 20 bi-directionally. It is the flow of this electric current that, during the operation of the stack 20, allows the direction of magnetization of the FL 28 to switch relative to the direction of magnetization of the RL 24. That is, upon manufacturing of the stack 20, the RL 24 has a fixed magnetization. The magnetizations of the magnetic layer of stack 20, RL 24 and FL 28 in an embodiment of the invention, are in-plane relative to the film plane and in another embodiment of the invention are perpendicular to the film plane. However, the direction of magnetization of the FL 28 switches when electric current, of a suitable level, flows through the stack 20. As is readily known in the art, the FL 28 and the RL 24 are magnetic layers. In an exemplary embodiment of the invention, the angle of the magnetization of the FL 28 changes relative to that of the RL 24 in a manner as to produce resistance change across the stack 20. The layers SCL 30, FL 28, JL 26 and RL 24 form the MTJ of the stack 20.

The FL 28 may be made of different material and different structure in various embodiments of the invention. While other embodiments are contemplated, several exemplary embodiments of the FL 28 are now presented. In an embodiment of the invention, the FL 28 is made of any of magnetic elements of cobalt (Co), iron (Fe), nitride (Ni), with any of the non-magnetic elements of the following materials: boron (B), tantalum (Ta), titanium (Ti), platinum (Pt), palladium (Pd), chromium (Cr), copper (Cu), magnesium (Mg), oxygen (O), hafnium (Hf), nickel (N), manganese (Mn), zirconium (Zr), iridium (Ir), or silicon (Si).

In an embodiment of the invention, the FL 28 is multi-layered with a structure that comprises more than one layer and where these layers are interlaced. For example, FL 28 may be made of magnetic and non-magnetic layers with the magnetic layer being composed of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si; the non-magnetic layers any composition of any of the following elements: Pt, Pd, Ru, Ta, Ti, Cr, Cu, Mg, Hf, Cr, Mn, Zr, Ir, Si, C, or Ru; or an oxide made of any of the following materials: Mg, Al, Zn, Ta, Ti, Cu, Cr, Ru.

In an exemplary embodiment of the invention, the JL 26 is an oxide layer made of the following materials: Mg, Al, Zn, Ta, Ti, Cu, Cr, or it is a metal layer made of the following materials: copper (Cu), gold (Au), or silver (Ag), or it is formed of metal pillars in an oxide matrix.

The key invention point of embodiment of FIG. 2 resides in SCL 30 composition. The SCL 30 is also made of different structures and materials, in accordance with various embodiments of the invention. The following are exemplary materials and structures of which the SCL 30 is made:

ruthenium oxide layer and in an embodiment of the invention, with thickness of the SCL 30 being 0.6 nano meters (nm-5 nm.

conductive dielectric layer with the oxide being any one of or a mixture of, without limitation the following materials: Zn, Ru, Ti, Ir, V, Cr, Molybdenum (Mo), Lithium-Molybdenum (LiMn), Tin (Sn), Fe or Co and in an embodiment of the invention, with thickness of the SCL 30 being 0.6 nm-5 nm.

conductive nitride layer with the nitride made of the following material, without limitation: Ta, Ti, W, Cu, Nb, Zr, Cr, or V.

conductive carbide layer with the carbide made of the following material, without limitation: Ti, Zr, Hf, V, Nb, Ta, Cr, Mo, or Tungsten (W).

nitride layer with the nitride made of any of the following material, without limitation: Co, Fe, Ni, Mg, Al, Ta, Ti, Pt, Pd, Ru, Cu, Hf, Mn, Ir, Si, or C.

carbide layer with the carbide composed of any of, without limitation: Co, Fe, Ni, Mg, Al, Pt, Pd, Ru, Cu, Mn, Ir, or Si.

non-metallic conductive layer that can be a composite of metal and non-metal, such as, without limitation, manganese arsenide (MnAs).

non-metal conductive layer that can be made of, without limitation, diamond-like carbon or graphene carbon.

a layer that is composed of metallic atom or crystals dispersed in non-metallic insulating layer, which can be formed by the following: Metal atoms implanted in non-metallic insulating layer by plasma; Metal mixture with an oxide layer by co-sputtering from a metal target and an non-metallic insulating layer target; Metal and oxide deposited in super-lattice structure with interlacing sub-nanometer thickness metal layer and sub-nanometer non-metallic insulating layer, which may also be further adjusted by an annealing process after deposition. The metal layer can be any one or an alloy of the following, without limitation: Mg, Al, Zn, Ta, Ti, Cu, Cr, Ag, Au, Cu, Fe, Co, Pt, Cr, Zr, Hf, Ir, Zn, V, Mo, Li, or Ru. The non-metallic insulating layer is an oxide/nitride/carbide, which can be made of oxide/nitride/carbide of any of the following material without limitation: to, Co, Fe, Ni, Mg, Al, Ta, Ti, Pt, Pd, Ru, Cr, Cu, Hf, Mn, Zr, Ir, or Si In some embodiments, the TL 32 is made of a single layer. In some embodiments, the TL 32 has a multi-layered structure suitable to make the stack 20 work. In this multi-layered structure, the multi-layers may contain magnetic, non-magnetic, conductive or insulating layers. In another embodiment, the TL 32 can be a single layer or multi-layer structure required to make MTJ design work in STT-MRAM, where in the multi-layer structure may contain magnetic, non-magnetic, conductive or insulating layers. In yet another embodiment, the TL 32 can have an interface layer in contact with SCL. The interface layer can be made of any of, or an alloy of the following materials, without limitation: Co, Fe, Ni, Mg, Al, Ta, Ti, Pt, Pd, Ru, Cr, Cu, Hf, Mn, Zr, Ir, Si, or C; wherein the interface layer is Ta; wherein the interface layer is made of the alloy cobolt-iron-boron (CoFeB) or the material Mg.

The BL 22, in an embodiment of the invention, is a single layer and in another embodiment, it is multi-layered in a manner that is suitable to the operation of the stack 20. In yet other embodiments, the BL 22 may contain a pinned layer, a synthetic anti-ferromagnetic structure, an anti-ferromagnetic (AFM) layer, or seed layers. The BL 22, in various embodiments of the invention, may contain magnetic, non-magnetic, conductive or insulating layers.

In yet other embodiments of the invention, the stack 20 may be formed upside down with the TL 32 being formed in the place of the BL 22, shown in FIG. 1, and the BL being formed in place of the TL 32.

The SCL 30, by virtue of being adjacent to the FL 28, serves to advantageously suppress spin-pumping and also to maintain low resistance of the stack 20. More specifically, the non-metallic conductive layer of the SCL 30 serves two purposes: (1) suppression of spin-pumping by lattice and/or layer structure; and (2) avoid contribution to too high of a resistance of the stack 20.

Figure 3:
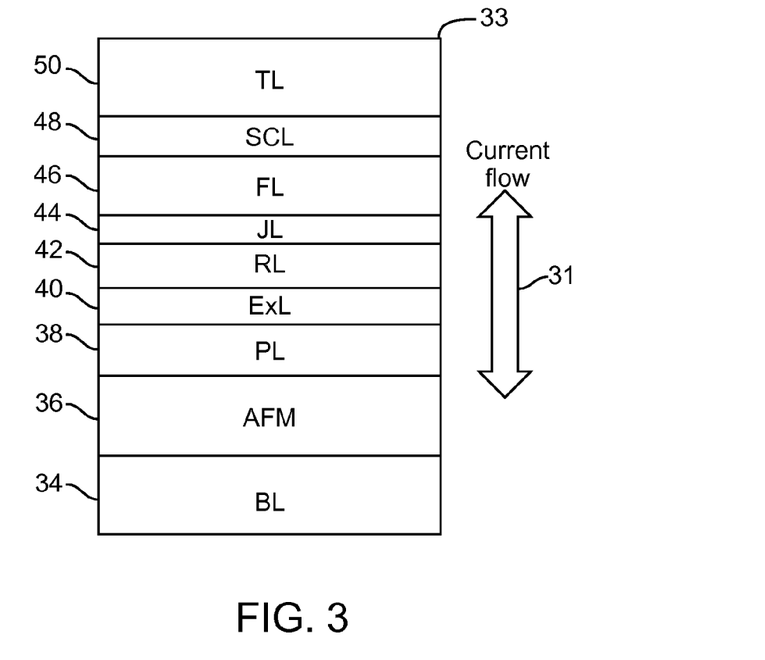
FIG. 3 shows a STTMRAM MTJ stack 33, in accordance with another embodiment of the invention.

FIG. 3 shows a STTMRAM MTJ stack 33, in accordance with another embodiment of the invention. The stack 33 is analogous to the stack 20 except for that which is otherwise stated or shown herein. The stack 33 is shown to include a BL 34 on top of which is shown formed an anti-ferromagnetic layer (AFM) 36, on top of the which is shown formed a pinned layer (PL) 38, on top of the which is shown formed an exchange layer (ExL) 40, on top of which is shown formed a RL 42, on top of which is shown formed a JL 44, on top of which is shown formed the FL 46, on top of which is shown formed the SCL 48, on top of which is shown formed the TL 50.

The layers BL 34, JL 44, SCL 48, and TL 50 are analogous to their counterpart in the stack 20. In an embodiment of the invention, the FL 46, RL 42, and PL 38 are each made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si. In an embodiment of the invention, the BL 46, RL 42, and PL 38 are each multi-layered structures with magnetic layer and non-magnetic layers interlaced. In the latter embodiment, the magnetic layer(s) is made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si, and the non-magnetic layer is made of any composition of any of the following materials: Pt, Pd, Ru, Ta, Ti, Cr, Cu, Mg, Hf, Cr, Mn, Zr, Ir, Si, or C or the non-magnetic layer is made of an oxide of the following materials: Mg, Al, Zn, Ta, Ti, Cu, Cr, or Ru. As with stack 20, the magnetization of the magnetic layers of the stack 33, which in the embodiment of FIG. 3 are comprised of the PL 38RL 42, FL 46, may be in the film plane for in-plane MTJ and perpendicular to the film plane for perpendicular MTJs.

The TL 50 is made of the materials listed above relative to the TL 32 of FIG. 1. In another embodiment of the invention, the TL 50 is made of an interface layer that is in contact with the SCL 48. The interface layer of the TL 50 may be any of, or an alloy of, without limitation, the following materials: Co, Fe, Ni, Mg, Al, Ta, Ti, Pt, Pd, Ru, Cr, Cu, Hf, Mn, Zr, Ir, Si, or C; wherein the interface layer is made of CoFeB; and where the interface layer is made of Mg.

In an embodiment of the invention, the ExL 40 provides anti-ferromagnetic coupling between the RL 42 and the PL 38 and forms a SAF structure with a RL-ExL-PL tri-layer stack. In another embodiment of the invention, the ExL is made of Ru. In an embodiment of the invention the AFM 36 is made of, without limitation, any of the following materials: PtMn, IrMn.

In operation, the AFM exchange (in the layer AFM 36) couples to the PL 38 and pins the SAF magnetically in embodiments where the SAF structure is formed.

In an alternative structure, the entire stack 33 is upside down. For example, the layer BL 34 being in place of the TL 50 and the layer TL 50 being in place of the layer BL 34.

During operation, bidirectional electric current flows through the stack 33, as shown by the arrow 31, to program the stack by causing switching of the direction of magnetization of the FL 46.

Figure 4:
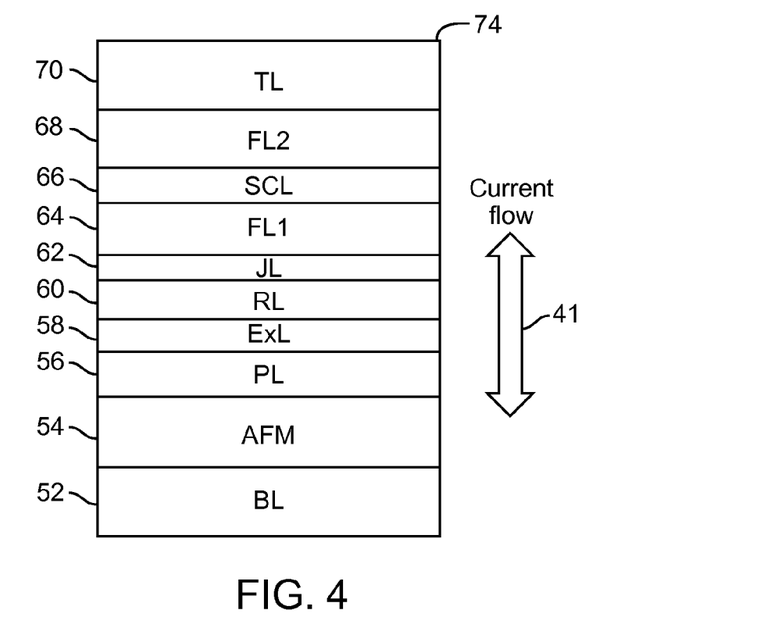
FIG. 4 shows a STTMRAM MTJ stack 74, in accordance with another embodiment of the invention.

FIG. 4 shows a STTMRAM MTJ stack 74, in accordance with another embodiment of the invention. The stack 74 is analogous to the stack 33 except for that which is otherwise stated or shown herein. The stack 74 is shown to include a BL 52 on top of which is shown formed an AFM 54, on top of which is shown formed a PL 56, on top of the which is shown formed an ExL 58, on top of which is shown formed a RL 60, on top of which is shown formed a JL 62, on top of which is shown formed the FL 1 64, on top of which is shown formed the SCL 66, on top of which is shown formed the FL 2 68, on top of which is shown formed the TL 70.

The layers BL 52, AFM 54, PL 56, ExL 58, RL 60, JL 62, SCL 66, and TL 70 are analogous to their counterpart in the stack 33.

The layers BL 52, JL 62, SCL 66, and TL 70 are analogous to their counterpart in the stack 20. In an embodiment of the invention, the FL 1 64, FL 2 68, RL 60, and PL 56 are each made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si. In an embodiment of the invention, the FL 1 64, FL 2 68, RL 60, and PL 56 are each multi-layered structures with magnetic layer and non-magnetic layers interlaced. In the latter embodiment, the magnetic layer(s) is made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si, and the non-magnetic layer is made of any composition of any of the following materials: Pt, Pd, Ru, Ta, Ti, Cr, Cu, Mg, Hf, Cr, Mn, Zr, Ir, Si, or C or the non-magnetic layer is made of an oxide of the following materials: Mg, Al, Zn, Ta, Ti, Cu, Cr, or Ru. As with stack 20, the magnetizations of the magnetic layers of the stack 74, which in the embodiment of FIG. 4 are comprised of the PL 56, RL 60, FL 1 64, and FL 2 68, may be in the film plane for in-plane MTJ or perpendicular to the film plane for perpendicular MTJs.

The FL 1 64 is analogous to the FL 46. The FL 2 68 is magnetic layer, in an embodiment of the invention, having an interface layer that is in contact with the SCL. The interface layer is made of any of, or any alloy of, without limitation, the following materials: Co, Fe, Ni, Mg, Al, Ta, Ti, Pt, Pd, Ru, Cr, Cu, Hf, Mn, Zr, Ir, Si, or C; where the interface layer is CoFeB. In an embodiment of the invention, the FL 1 64 and the FL 2 68 are anti-ferromagnetically coupled to each other through magneto-static field across the SCL 66

In an alternative structure, the entire stack 74 is upside down. For example, the layer BL 52 being in place of the TL 70 and the layer TL 70 being in place of the layer BL 52.

During operation, bidirectional electric current flows through the stack 74, as shown by the arrow 41, to program the stack by causing switching of the direction of magnetization of the layers FL 1 64 and FL 2 68.

Figure 5:
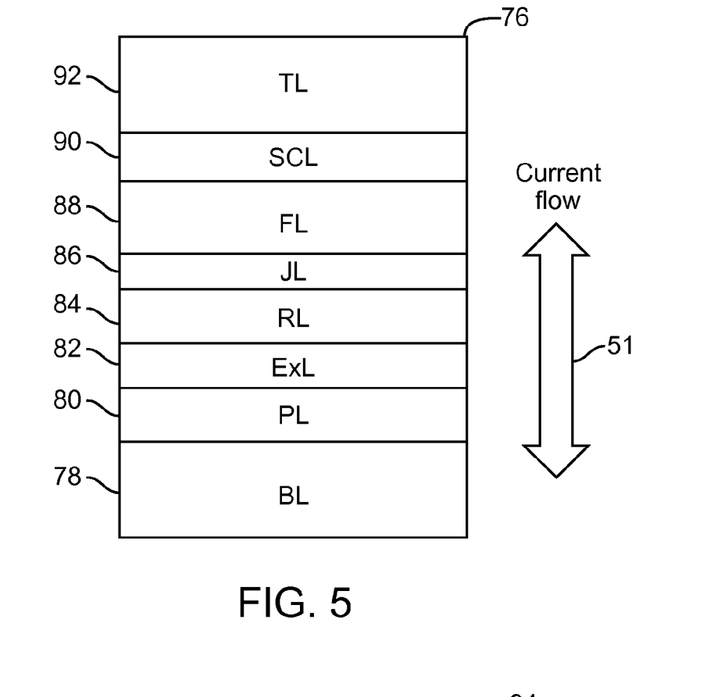
FIG. 5 shows a STTMRAM MTJ stack 76, in accordance with another embodiment of the invention.

FIG. 5 shows a STTMRAM MTJ stack 76, in accordance with another embodiment of the invention. The stack 76 is analogous to the stack 33 except for that which is otherwise stated or shown herein. The stack 76 is shown to include a BL 78 on top of which is shown formed an a PL 80, on top of the which is shown formed an ExL 82, on top of which is shown formed a RL 84, on top of which is shown formed a JL 86, on top of which is shown formed the FL 88, on top of which is shown formed the SCL 90, on top of which is shown formed the TL 92.

The layers BL 78, PL 80, ExL 82, RL 84, JL 86, FL 88, SCL 90, and TL 92 are analogous to their counterpart in the stack 33. In an embodiment of the invention, the FL 88, RL 84, and PL 80 are each made any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si. In an embodiment of the invention, the layers FL 88, RL 84, and PL 80 are each multi-layered structures with magnetic layer and non-magnetic layers interlaced. In the latter embodiment, the magnetic layer(s) is made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si, and the non-magnetic layer is made of any composition of any of the following materials: Pt, Pd, Ru, Ta, Ti, Cr, Cu, Mg, Hf, Cr, Mn, Zr, Ir, Si, or C or the non-magnetic layer is made of an oxide of the following materials: Mg, Al, Zn, Ta, Ti, Cu, Cr, or Ru. As with stack 20, the magnetization of the magnetic layers of the stack 76, which in the embodiment of FIG. 5 are comprised of the PL 80, RL 84 FL 88 may be in the film plane for in-plane MTJ or perpendicular to the film plane for perpendicular MTJs.

In an embodiment of the invention, the TL 92 is made of an interface layer that is in contact with SCL 90. In such embodiments, the interface layer can be made of any of, or an alloy of the following materials, without limitation: Co, Fe, Ni, Mg, Al, Ta, Ti, Pt, Pd, Ru, Cr, Cu, Hf, Mn, Zr, Ir, Si, C; where the interface layer is made of CoFeB. [Yuchen: Same issue as above here.]

In an alternative structure, the entire stack 76 is upside down. For example, the layer BL 78 being in place of the TL 92 and the layer TL 92 being in place of the layer BL 78.

The relative change in the magnetization angle of the FL 88 and the RL 84 produces resistance change across the stack 76, during the operation thereof.

During operation, bidirectional electric current flows through the stack 76, as shown by the arrow 51, to program the stack by causing switching of the direction of magnetization of the layers FL 88.

Figure 6:
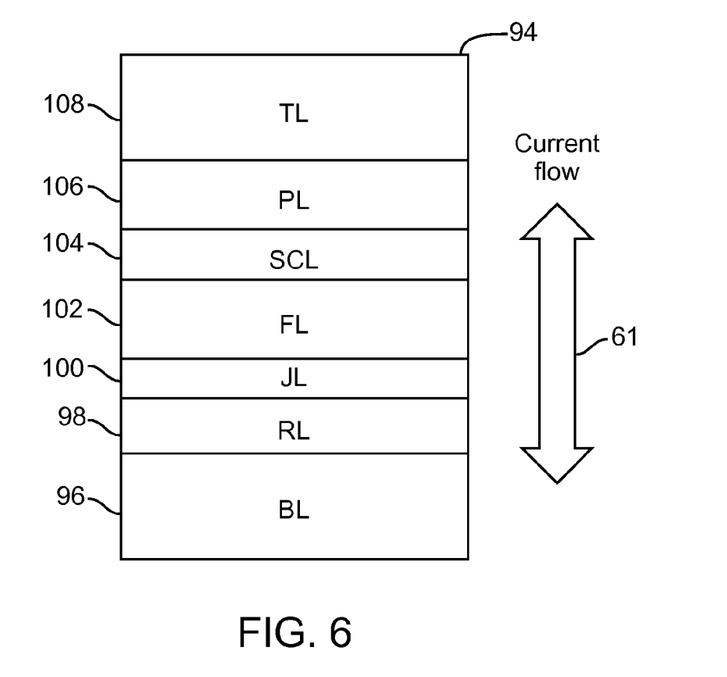
FIG. 6 shows a STTMRAM MTJ stack 94, in accordance with another embodiment of the invention.

FIG. 6 shows a STTMRAM MTJ stack 94, in accordance with another embodiment of the invention. The stack 94 is analogous to the stack 76 except for that which is otherwise stated or shown herein. The stack 94 is shown to include a BL 96 on top of which is shown formed an a RL 98, on top of which is shown formed an JL 100, on top of which is shown formed a FL 102, on top of which is shown formed a SCL 104, on top of which is shown formed the FL 88, on top of which is shown formed the SCL 90, on top of which is shown formed the TL 92.

The layers BL 96, PL 106, RL 98, JL 100, SCL 104, FL 102 and TL 108 are analogous to their counterpart in the stack 76. In an embodiment of the invention, the FL 102, RL 98, and PL 106 are each made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si. In an embodiment of the invention, the layers FL 88, RL 84, and PL 80 are each multi-layered structures with magnetic layer and non-magnetic layers interlaced. In the latter embodiment, the magnetic layer(s) is made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si, and the non-magnetic layer is made of any composition of any of the following materials: Pt, Pd, Ru, Ta, Ti, Cr, Cu, Mg, Hf, Cr, Mn, Zr, Ir, Si, or C or the non-magnetic layer is made of an oxide of the following materials: Mg, Al, Zn, Ta, Ti, Cu, Cr, or Ru. As with stack 76, the magnetization of the magnetic layers of the stack 94, which in the embodiment of FIG. 6 are comprised of the PL 106, RL 98, FL 102 may be in the film plane for in-plane MTJ or perpendicular to the film plane for perpendicular MTJs.

In an embodiment of the invention, the TL 108 has of an interface layer that is in contact with PL 106. In such embodiments, the interface layer can be made of any of, or an alloy of the following materials, without limitation: Co, Fe, Ni, Mg, Al, Ta, Ti, Pt, Pd, Ru, Cr, Cu, Hf, Mn, Zr, Ir, Si, C; where the interface layer is made of CoFeB.

In an alternative structure, the entire stack 94 is upside down. For example, the layer BL 96 being in place of the TL 108 and the layer TL 108 being in place of the layer BL 96.

The relative change in the magnetization angle of the FL 102 and the RL 98 produces resistance change across the stack 76, during the operation thereof and the magnetizations of the PL 106 and the RL 98 oppose each other.

As in all of the embodiments shown and discussed herein, magnetization of the MTJ of the stack 94, which is made of the RL 98, JL 100, FL 102, SCL 104, and PL 106, is in-plane relative to the film plane or perpendicular.

During operation, bidirectional electric current flows through the stack 94, as shown by the arrow 61, to program the stack by causing switching of the direction of magnetization of the layers FL 102.

Figure 7:
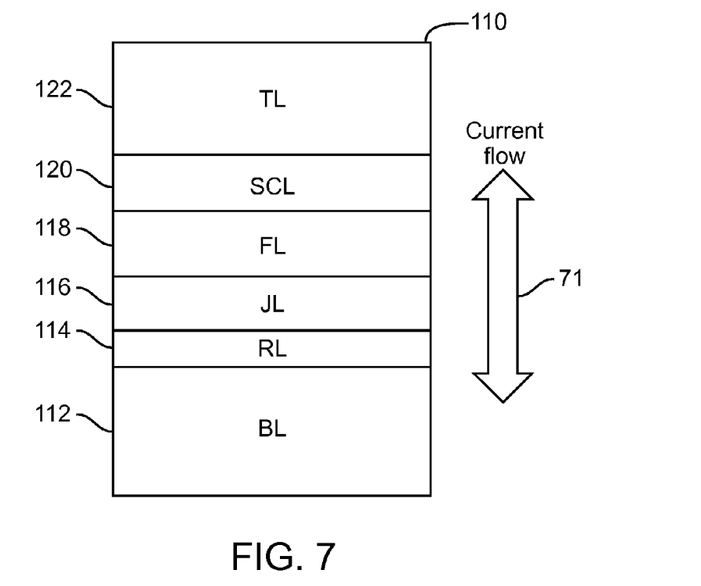
FIG. 7 shows a STTMRAM MTJ stack 110, in accordance with another embodiment of the invention.

FIG. 7 shows a STTMRAM MTJ stack 110, in accordance with another embodiment of the invention. The stack 110 is analogous to the stack 20 except for that which is otherwise stated or shown herein. The stack 110 is shown to include a BL 112 on top of which is shown formed an a RL 114, on top of which is shown formed an JL 116, on top of which is shown formed a FL 118, on top of which is shown formed a SCL 120, on top of which is shown formed the TL 122.

The layers BL 112, RL 114, JL 116, FL 118, SCL 120, and TL 122 are analogous to their counterpart in the stack 20 except where noted herein. In an embodiment of the invention, the FL 118, and the RL 114 are each made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si. In an embodiment of the invention, the layers FL 118, and the RL 114 are each multi-layered structures with magnetic layer and non-magnetic layers interlaced. In the latter embodiment, the magnetic layer(s) is made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si, and the non-magnetic layer is made of any composition of any of the following materials: Pt, Pd, Ru, Ta, Ti, Cr, Cu, Mg, Hf, Cr, Mn, Zr, Ir, Si, or C or the non-magnetic layer is made of an oxide of the following materials: Mg, Al, Zn, Ta, Ti, Cu, Cr, or Ru. As with stack 20, the magnetizations of the magnetic layers of the stack 110, which in the embodiment of FIG. 7 is comprised of the RL 114, FL 118, may be in the film plane for in-plane MTJ or perpendicular to the film plane for perpendicular MTJs.

Referring still to FIG. 7, the relative magnetization angle change of the FL 118 and the RL 114 produces resistance change across the stack 110.

In an embodiment of the invention, the JL 116 is made of an oxide layer made of the materials: Mg, Al, Zn, Ta, Ti, Cu, Cr; or a metal layer made of the materials: Cu, Au, or Ag; or metal pillars in an oxide matrix.

In an embodiment of the invention, the SCL 120 is made of a doped oxide layer with an exemplary thickness of 0.6 nm-5 nm. In these embodiments, the oxide in the doped oxide layer can be an oxide of any one of or a mixture of, the following materials, without limitation: Mg, Al, Zn, Ta, Ti, Cu, Cr, Zn, Ru, Ti, Ir, V, Cr, Mo, Li, Mn, Sn, Fe, or Co. The dopant can be any one of or a mixture of the following materials, without limitation: Mg, Ru, Fe, Li, Al, B, F, Cu, Co, Ni, Si, P, S, K, Sc, Ti, Cu and Rb. A particularly preferred embodiment of making the doped oxide layer is by co-sputtering Mg and Ru with subsequent oxygen where the atomic ratio of Ru/Mg is less than 50%. In an embodiment of the invention, the SCL 120 can also be a super-lattice structure with interlacing sub-nanometer thickness metal layer and sub-nanometer doped oxide layer, which may also be further adjusted by an annealing process after deposition, during manufacturing of the stack 110. In another embodiment of invention, the SCL 120 can also be a super-lattice structure with interlacing sub-nanometer thickness doped oxide layer and sub-nanometer non-metallic insulating layer, which may also be further adjusted by an annealing process after deposition, during manufacturing.

In an embodiment of the invention, the TL 122 is made of a single layer or in other embodiments, it has a multi-layer structure that is suitable for STTMRAM devices. In the latter embodiments, where the TL 122 is multi-layered, it may contain magnetic, non-magnetic, conductive or insulating layers, or combinations thereof. In another embodiment of the invention, the TL 122 has an interface layer that is in contact with SCL 120. In the latter embodiments, the interface layer can be made of any of, or an alloy of the following materials, without limitation: Co, Fe, Ni, Mg, Al, Ta, Ti, Pt, Pd, Ru, Cr, Cu, Hf, Mn, Zr, Ir, Si, C or CoFeB.

In an embodiment of the invention, the BL 112 is a single layer and in another embodiment, it is a multi-layered structure suitable for MTJ designs employed in STTMRAM devices. The BL 112 may itself include another layer, such as a pinned layer, SAF structure, AFM layer, or other seed layers. It may also contain other magnetic, non-magnetic, conductive or insulating layers.

The entire structure of the stack 110 can alternatively be upside down such that the TL 122 is in place of the BL 112 and vice versa and the SCL 120 is formed on top of the TL 122, the FL 118 is formed on top of the SCL 120, the JL 116 is formed on top of the FL 118, the RL 114 is formed on top of the JL 116, and the BL 112 is formed on top of the RL 114.

As in all of the embodiments shown and discussed herein, magnetization of the magnetic layers of the stack 110, which are RL 114, FL 118, are in-plane relative to the film plane or perpendicular.

During operation, bidirectional electric current flows through the stack 110, as shown by the arrow 71, to program the stack by causing switching of the direction of magnetization of the layer FL 118.

Figure 8:
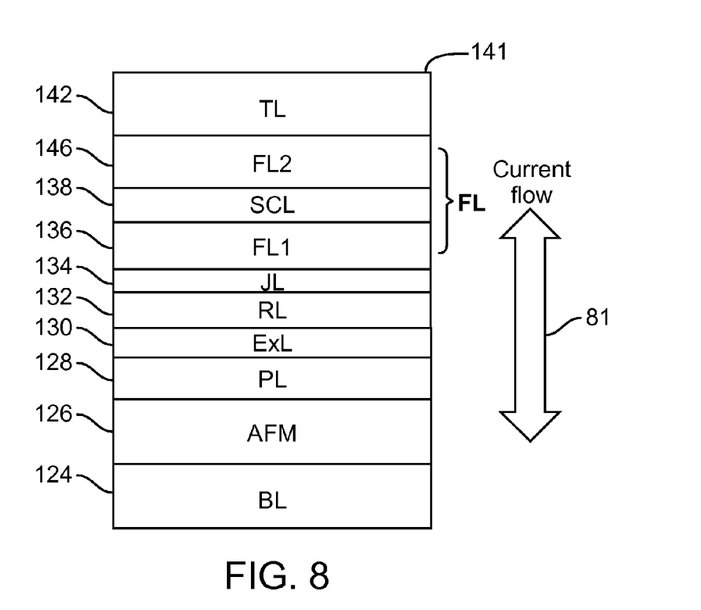
FIG. 8 shows a STTMRAM MTJ stack 141, in accordance with another embodiment of the invention.

FIG. 8 shows a STTMRAM MTJ stack 141, in accordance with another embodiment of the invention. The stack 141 is analogous to the stack 74 of FIG. 4 except for that which is otherwise stated or shown herein. The stack 141 is shown to include a BL 124 on top of which is shown formed an AFM 126, on top of which is shown formed a PL 128, on top of the which is shown formed an ExL 130, on top of which is shown formed a RL 130, on top of which is shown formed a JL 134, on top of which is shown formed the FL 1 64, on top of which is shown formed the SCL 138, on top of which is shown formed the FL 2 140, on top of which is shown formed the TL 142.

The layers BL 52, AFM 54, PL 56, ExL 58, RL 60, JL 62, SCL 66, and TL 70 are analogous to their counterpart in the stack 33.

The layer SCL 138 is made of a doped oxide layer with an exemplary thickness of 0.6 nm~5 nm. In these embodiments, the oxide in the doped oxide layer can be an oxide of any one of or a mixture of, the following materials, without limitation: Mg, Al, Zn, Ta, Ti, Cu, Cr, Zn, Ru, Ti, Ir, V, Cr, Mo, Li, Mn, Sn, Fe, or Co. The dopant can be any one of or a mixture of the following materials, without limitation: Mg, Ru, Fe, Li, Al, B, F, Cu, Co, Ni, Si, P, S, K, Sc, Ti, Cu and Rb. A particularly preferred embodiment of making the doped oxide layer is by co-sputtering Mg and Ru with subsequent oxygen where the atomic ratio of Ru/Mg is less than 50%.

The layers BL 124, JL 134, SCL 138, and TL 142 are analogous to their counterpart in the stack 74. In an embodiment of the invention, the FL 1 136, FL 2 140, RL 132, and PL 128 are each made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si. In an embodiment of the invention, the FL 1 136, FL 2 140, RL 132, and PL 128 are each multi-layered structures with magnetic layer and non-magnetic layers interlaced. In the latter embodiment, the magnetic layer(s) is made of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si, and the non-magnetic layer is made of any composition of any of the following materials: Pt, Pd, Ru, Ta, Ti, Cr, Cu, Mg, Hf, Cr, Mn, Zr, Ir, Si, or C or the non-magnetic layer is made of an oxide of the following materials: Mg, Al, Zn, Ta, Ti, Cu, Cr, or Ru. As with stack 74, the magnetization of the magnetic layers of the stack 141, which in the embodiment of FIG. 8 are, PL 128, RL 132, FL 1 136, and FL 2 140, may be in the film plane for in-plane MTJ or perpendicular to the film plane for perpendicular MTJs. The free layer of the MTJ of the stack 141 is made of a synthetic free layer comprising the FL 1 136, a doped oxide layer, as SCL 138, and the FL 2 140. During a switching event, both layers FL1 136 and FL2 140 magnetizations switch. When FL1 136 and FL2 140 magnetization are in-plane, they can be anti-parallel to each other and couples through anti-ferromagnetic type magneto-static field.

The relative magnetization angle change of the FL 1 136 and the RL 132 produces resistance change across the stack 141.

The FL 1 136 is analogous to the FL 64. The magnetic layer FL 2 140, in an embodiment of the invention, has an interface layer that is in contact with the SCL 138. The interface layer is made of any of, or any alloy of, without limitation, the following materials: Co, Fe, Ni, Mg, Al, Ta, Ti, Pt, Pd, Ru, Cr, Cu, Hf, Mn, Zr, Ir, Si, C, or CoFeB. In an embodiment of the invention, the ExL 130 provides anti-ferromagnetic coupling between the RL 132 and the PL 128 and forms a synthetic-antiferromagnetic (SAF) structure a RL-ExL-PL tri-layer stack. In an embodiment of the invention, the ExL 130 is made of Ru. In an embodiment of the invention, the AFM 126 is made of, without limitation, PtMn or IrMn. The AFM 126 couples to the PL 128 and pins the SAF structure magnetically.

In an alternative structure, the entire stack 141 is upside down. For example, the layer BL 124 being in place of the TL 142 and the layer TL 142 being in place of the layer BL 124.

During operation, bidirectional electric current flows through the stack 141, as shown by the arrow 81, to program the stack by causing switching of the direction of magnetization of the layers FL 1 136 and FL 2 140.

Figure 9:
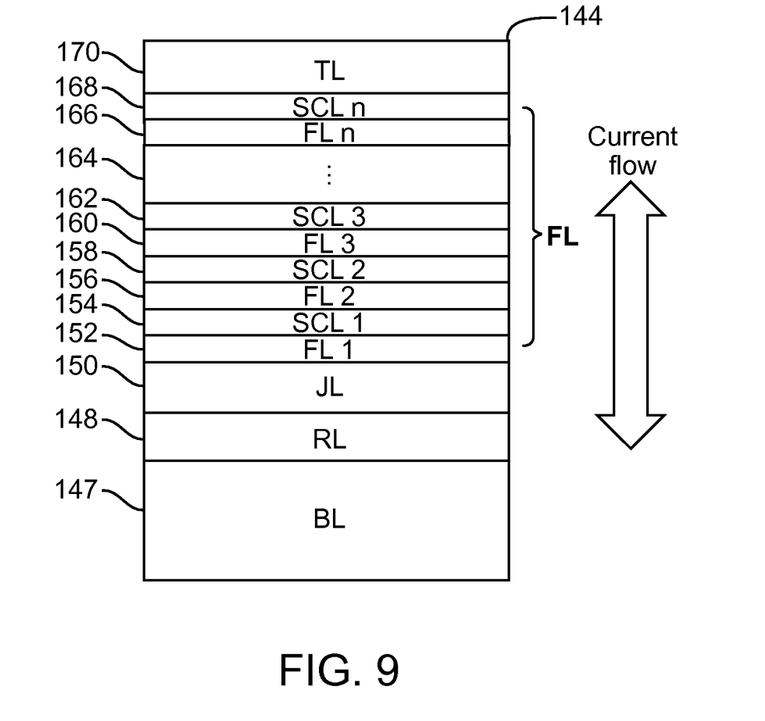
FIG. 9 shows a STTMRAM MTJ stack 144, in accordance with another embodiment of the invention.

FIG. 9 shows a STTMRAM MTJ stack 144, in accordance with another embodiment of the invention. The stack 144 is analogous to the stack 110 of FIG. 7 except that the free layer (FL) comprises 'n' number of alternating magnetic free layers (FL1, FL2, . . . , FLn) and SCL layers (SCL1, SCL2, . . . , SCLn), with 'n' being an integer value. For example, as shown in FIG. 9, each layer of the FL is made of FL 1 152 through FL n 166. Similarly, SCL comprises SCL 154 through SCL n 164. During a switching event, all FL1 through FLn layer magnetizations switch to directions that are opposite to their corresponding original directions.

In an embodiment of the invention, the FL 1 through FL n and the RL 148, each of these layers is a magnetic layer that can have a composition of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si. In an embodiment of the invention, each of these layers is a multi-layer structure that is interlaced by magnetic layers and non-magnetic layers, where the magnetic layer can be composed of any of magnetic elements of Co, Fe, Ni, with any of the non-magnetic elements of the following materials: B, Ta, Ti, Pt, Pd, Cr, Cu, Mg, O, Hf, N, Cr, Mn, Zr, Ir, or Si; and the non-magnetic layer can be a composition of any the following element(s) of, Pt, Pd, Ru, Ta, Ti, Cr, Cu, Mg, Hf, Cr, Mn, Zr, Ir, Si, C, or Ru, or it can also be an oxide of Mg, Al, Zn, Ta, Ti, Cu, Cr, or Ru.

As with previous embodiments, the magnetizations of the magnetic layers the FL 1 through FL n and the RL 148, are in the film plane for in-plane MTJ, or the magnetizations are perpendicular for perpendicular MTJ.

In an embodiment of the invention, the FL of the stack 144 is a multiple-layer comprising magnetic layers FL 1 - - - FL n and SCL 1 - - - SCL n. The interface of FL(n) and SCL(n) can further have an interface layer. The interface layer can be any of, or an alloy of the following, without limitation: Co, Fe, Ni, Mg, Al, Ta, Ti, Pt, Pd, Ru, Cr, Cu, Hf, Mn, Zr, Ir, Si, C or CoFeB. The layer SCL1 through SCLn are made of doped oxide layer with an exemplary thickness of 0.6 nm~5 nm. In these embodiments, the oxide in the doped oxide layer can be an oxide of any one of or a mixture of, the following materials, without limitation: Mg, Al, Zn, Ta, Ti, Cu, Cr, Zn, Ru, Ti, Ir, V, Cr, Mo, Li, Mn, Sn, Fe, or Co. The dopant can be any one of or a mixture of the following materials, without limitation: Mg, Ru, Fe, Li, Al, B, F, Cu, Co, Ni, Si, P, S, K, Sc, Ti, Cu and Rb. A particularly preferred embodiment of making the doped oxide layer is by co-sputtering Mg and Ru with subsequent oxygen where the atomic ratio of Ru/Mg is less than 50%.

In an embodiment of the invention, the BL 147 is a single layer or it can be a multi-layer structure suitable for MTJ designs employed in STTMRAM devices. The BL 146 may itself include another layer, such as a pinned layer, SAF structure, AFM layer, or other seed layers. It may also contain other magnetic, non-magnetic, conductive or insulating layers.

As with previous embodiments, the entire stack 144 can be upside down as an alternative Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A spin transfer torque magnetic random access memory (STTMRAM) magnetic tunnel junction (MTJ) stack made of layers to which when electric current is applied cause switching of the direction of magnetization of at least one of the layer comprising:
    a reference layer (RL) with a direction of magnetization that is fixed upon manufacturing of the STTMRAM MTJ stack;
    a junction layer (JL) formed on top of the RL;
    a free layer (FL) formed on top of the JL, the FL having a direction of magnetization that is switchable relative to that of the RL upon the flow of electric current through the spin transfer torque magnetic random access memory (STTMRAM) magnetic tunnel junction (MTJ) stack;
    a spin confinement layer (SCL) formed on top of the FL, the SCL made of conductive dielectric layer with a thickness of 0.6 nano meters (nm) to 5 nm.

2. The STTMRAM MTJ stack of claim 1, wherein the RL comprises a stack of anti-ferromagnetic layer, magnetic pinned layer, exchange coupling layer and magnetic reference layer.

3. The STTMRAM MTJ stack of claim 1, wherein further including a second free layer 2 on top of the SCL layer.

4. The STTMRAM MTJ stack of claim 1, wherein the RL comprises a stack of magnetic pinned layer, exchange coupling layer and magnetic reference layer.

5. The STTMRAM MTJ stack of claim 1, wherein further including a magnetic pinned layer formed on top of the SCL layer.

6. The STTMRAM MTJ stack of claim 1, wherein the SCL comprises oxide doped with metallic elements.

7. The STTMRAM MTJ stack of claim 1, wherein the SCL is made by co-sputtering Mg and Ru with subsequent oxygen where the atomic ratio of Ru/Mg is less than 50%.

8. The STTMRAM MTJ stack of claim 1, further including a bottom electrode (BL) on top of which is formed the RL.

9. The STTMRAM MTJ stack of claim 1, further including a top electrode (TL) formed as the top capping layer of the stack.

10. The STTMRAM MTJ stack of claim 1, wherein all the magnetic layers within the stack is made of a material comprising any of: cobolt (Co), iron (Fe), nickel (N), in combination with any of boron (B), tantalum (Ta), titanium (Ti), nitride (Ni), platinum (Pt), palladium (Pd), chromium (Cr), copper (Cu), magnesium (Mg), oxide (O), hafnium (Hf), manganese (Mn), zirconium (Zr), iridium (Ir), or silicon (Si).

11. The STTMRAM MTJ stack of claim 1, wherein the FL is multi-layered with a structure that comprises more than one layer that are interlaced.

12. The STTMRAM MTJ stack of claim 1, wherein the FL is made of magnetic and non-magnetic layers with at least one of the magnetic layers of the FL comprises: Co, Fe, or Ni, in combination with any of B, Ta, Ti, Pt, Pd, Cr, Cu, Mg, O, Hf, N, Mn, Zr, Ir, or Si.

13. The STTMRAM MTJ stack of claim 6, wherein at least one of the non-magnetic layers of the FL comprises: Pt, Pd, Ru, Ta, Ti, Cr, Cu, Mg, Hf, Cr, Mn, Zr, Ir, Si, C, or Ru; or an oxide made of any of the following materials: Mg, Al, Zn, Ta, Ti, Cu, Cr, or Ru.

14. The STTMRAM MTJ stack of claim 1, wherein the JL is an oxide layer comprising: Mg, Al, Zn, Ta, Ti, Cu, Cr.

15. The STTMRAM MTJ stack of claim 1, wherein the JL is a metal layer and comprises: Cu, Au, or silver (Ag).

16. The STTMRAM MTJ stack of claim 1, wherein the JL is formed of metal pillars in an oxide matrix.

17. The STTMRAM MTJ stack of claim 1, wherein the SCL is composed of conductive oxide layer with the oxide being any one of or a mixture of, without limitation, the following materials: Zn, Ru, Ti, Ir, V, Cr, Molybdenum (Mo), Lithium-Molybdenum (LiMn), Tin (Sn), Fe or Co.

18. The STTMRAM MTJ stack of claim 1, wherein the SCL is composed of conductive nitride layer with the nitride made of the following material, without limitation: Ta, Ti, W, Cu, Nb, Zr, Cr, or V.

19. The STTMRAM MTJ stack of claim 1, wherein the SCL is composed of conductive carbide layer with the carbide made of the following material, without limitation: Ti, Zr, Hf, V, Nb, Ta, Cr, Mo, or Tungsten (W).

20. The STTMRAM MTJ stack of claim 6, wherein the oxide in the doped oxide layer can be an oxide of any one of or a mixture of, the following materials, without limitation: Mg, Al, Zn, Ta, Ti, Cu, Cr, Zn, Ru, Ti, Ir, V, Cr, Mo, Li, Mn, Sn, Fe, or Co.

21. The STTMRAM MTJ stack of claim 6, wherein the dopant is a mixture comprising: Mg, Ru, Fe, Li, Al, B, F, Cu, Co, Ni, Si, P, S, K, Sc, Ti, Cu or Rb.

22. The STTMRAM MTJ stack of claim 1, wherein further including an integer number of repeat of alternating additional magnetic free layers and additional SCL layer on top of the SCL layer.

23. A spin transfer torque magnetic random access memory (STTMRAM) magnetic tunnel junction (MTJ) stack made of layers to which when electric current is applied cause switching of the direction of magnetization of at least one of the layer comprising:
a reference layer (RL) with a direction of magnetization that is fixed upon manufacturing of the STTMRAM MTJ stack;
a junction layer (JL) formed on top of the RL;
a free layer (FL) formed on top of the JL, the FL having a direction of magnetization that is switchable relative to that of the RL upon the flow of electric current through the spin transfer torque magnetic random access memory (STTMRAM) magnetic tunnel junction (MTJ) stack;
a spin confinement layer (SCL) formed on top of the FL, the SCL being a nitride layer with the thickness of the SCL being 0.6 nano meters (nm)-5 nm.

24. The STTMRAM MTJ stack of claim 23, wherein the SCL comprises nitride composed of any of the following material, without limitation: Co, Fe, Ni, Mg, Al, Ta, Ti, Pt, Pd, Ru, Cu, Hf, Mn, Ir, Si, or C.

25. A spin transfer torque magnetic random access memory (STTMRAM) magnetic tunnel junction (MTJ) stack made of layers to which when electric current is applied cause switching of the direction of magnetization of at least one of the layer comprising:
a reference layer (RL) with a direction of magnetization that is fixed upon manufacturing of the STTMRAM MTJ stack;
a junction layer (JL) formed on top of the RL;
a free layer (FL) formed on top of the JL, the FL having a direction of magnetization that is switchable relative to that of the RL upon the flow of electric current through the spin transfer torque magnetic random access memory (STTMRAM) magnetic tunnel junction (MTJ) stack;
a spin confinement layer (SCL) formed on top of the FL, the SCL being a carbide layer with the thickness of the SCL being 0.6 nano meters (nm)-5 nm.

26. The STTMRAM MTJ stack of claim 25, wherein the SCL is a carbide composed of any of the following material, without limitation: Co, Fe, Ni, Mg, Al, Pt, Pd, Ru, Cu, Mn, Ir, or Si.

27. A spin transfer torque magnetic random access memory (STTMRAM) magnetic tunnel junction (MTJ) stack made of layers to which when electric current is applied cause switching of the direction of magnetization of at least one of the layer comprising:
a reference layer (RL) with a direction of magnetization that is fixed upon manufacturing of the STTMRAM MTJ stack;
a junction layer (JL) formed on top of the RL;
a free layer (FL) formed on top of the JL, the FL having a direction of magnetization that is switchable relative to that of the RL upon the flow of electric current through the spin transfer torque magnetic random access memory (STTMRAM) magnetic tunnel junction (MTJ) stack;
a spin confinement layer (SCL) formed on top of the FL, the SCL being a layer made of non-metallic conductive layer composed of at least one metal element and at least one non-metal element with the thickness of the SCL being 0.6 nano meters (nm)-5 nm.

28. The STTMRAM MTJ stack of claim 27, wherein the SCL is made of manganese arsenide (MnAs).

29. The STTMRAM MTJ stack of claim 27, wherein the SCL comprises:
metal atoms implanted in non-metallic insulating layer by plasma;
metal mixture with an oxide layer by co-sputtering from a metal target and an non-metallic insulating layer target; and
metal and oxide deposited in super-lattice structure with interlacing sub-nanometer thickness metal layer and sub-nanometer non-metallic insulating layer, wherein the metal layer can be any one or an alloy of the following, without limitation: Mg, Al, Zn, Ta, Ti, Cu, Cr, Ag, Au, Cu, Fe, Co, Pt, Cr, Zr, Hf, Ir, Zn, V, Mo, Li, or Ru and the non-metallic insulating layer is an oxide/nitride/carbide, which can be made of oxide/nitride/carbide of any of the following material without limitation: to, Co, Fe, Ni, Mg, Al, Ta, Ti, Pt, Pd, Ru, Cr, Cu, Hf, Mn, Zr, Ir, or Si.

30. A spin transfer torque magnetic random access memory (STTMRAM) magnetic tunnel junction (MTJ) stack made of layers to which when electric current is applied cause switching of the direction of magnetization of at least one of the layer comprising:
a reference layer (RL) with a direction of magnetization that is fixed upon manufacturing of the STTMRAM MTJ stack;
a junction layer (JL) formed on top of the RL;

a free layer (FL) formed on top of the JL, the FL having a direction of magnetization that is switchable relative to that of the RL upon the flow of electric current through the spin transfer torque magnetic random access memory (STTMRAM) magnetic tunnel junction (MTJ) stack;

a spin confinement layer (SCL) formed on top of the FL, the SCL being a layer made of composed of metallic atom or crystals dispersed in non-metallic insulating layer with the thickness of the SCL being 0.6 nano meters (nm)-5 nm.

* * * * *